(12) United States Patent
Xing et al.

(10) Patent No.: US 6,410,426 B1
(45) Date of Patent: Jun. 25, 2002

(54) DAMASCENE CAP LAYER PROCESS FOR INTEGRATED CIRCUIT INTERCONNECTS

(75) Inventors: Guoqiang Xing; Ping Jiang, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/901,392

(22) Filed: Jul. 9, 2001

(51) Int. Cl.[7] .......................... H01L 21/4763
(52) U.S. Cl. .............. 438/638; 438/618; 438/634; 438/970
(58) Field of Search ................... 438/597, 638, 438/618, 634, 687, 970, 689, 780

(56) References Cited

U.S. PATENT DOCUMENTS

| | | | | |
|---|---|---|---|---|
| 6,245,690 B1 | * | 6/2001 | Yau et al. | 438/780 |
| 6,303,523 B2 | * | 10/2001 | Cheung et al. | 438/780 |
| 6,326,301 B1 | * | 12/2001 | Venkatesan et al. | 438/638 |
| 6,340,435 B1 | * | 1/2002 | Bjorkman et al. | 216/72 |

* cited by examiner

*Primary Examiner*—John F. Niebling
*Assistant Examiner*—Walter L. Lindsay, Jr.
(74) *Attorney, Agent, or Firm*—Peter K. McLarty; W. James Brady, III; Frederick J. Telecky, Jr.

(57) ABSTRACT

The invention describes a method for forming integrated circuit interconnects. A capping layer (50) is formed on a low k dielectric layer (40). The capping layer (50) and the low k dielectric layer (40) are etched to form a via and/or trench in the low k dielectric (4) which is filled with a conducting material (90) (95).

6 Claims, 2 Drawing Sheets

DAMASCENE CAP LAYER PROCESS FOR INTEGRATED CIRCUIT INTERCONNECTS

FIELD OF THE INVENTION

The invention is generally related to the field of semiconductor devices and fabrication and more specifically to a method for forming copper lines in integrated circuits using a cap layer process.

BACKGROUND OF THE INVENTION

To increase the operating speed, high performance integrated circuits use copper interconnect technology along with low dielectric constant (low k) dielectrics. Currently the damascene method is the most widely used method for forming copper interconnects. In a single damascene trench process, the IMD (Intra-Metal Dielectric) is deposited first. The IMD is then patterned and etched to form trenches for the interconnect lines. A barrier layer and a copper seed layer are then deposited over the structure. The barrier layer is typically tantalum nitride or some other binary transition metal nitride. The copper layer is electrochemically deposited (ECD) using the seed layer over the entire structure. The copper is then chemically-mechanically polished (CMP'd) to remove the excess copper from the surface of the dielectric. The single damascene copper via formation in the ILD (Inter-Level Dielectric) can be accomplished in a similar way. In a via-first dual damascene process, an ILD layer is deposited first, followed by an IMD deposition. An IMD etch-stop layer, such as SiN or SiC, can be optionally used in between ILD and IMD. A via is patterned and etched through the IMD and ILD for connection to lower interconnect levels. Then a trench is patterned and etched in the IMD. The barrier layer, copper seed layer and thick copper layer are then deposited over the entire structure. CMP is used to remove the copper from over the IMD, leaving copper interconnect lines and vias.

During the damascene process a number of photolithograph, etch, and clean-up processes are used. Using the low k dielectric films, a number of unwanted interactions occur between these films and the photolithograph, etch, and clean-up processes. The dry etching of the low k dielectrics, such as organosilicate glass (OSG), often has poor selectivity to photoresist. The selectivity is worsened when 193 nm photoresist is used for patterning smaller vias or trenches. Resist erosion during etch can lead to trench and via flaring, and pitting of the dielectric surface. The severity of the problem increases during etch-stop etch and pre-sputter etch when no mask is present to protect the dielectric layer. Severe trench and via flaring, and pitting can result in metal shorts. Various methods have been utilized to try and reduce these interactions including the use of silicon nitride and silicon carbide hardmasks. A major limitation restricting the use of these various hardmasks is the low etch rate selectivity between the low k dielectric layers and these hardmask layers. Typical etch rate selectivity is in the range of ~1:3 to 1:8. There is therefore a need for an improved methodology for forming copper interconnects in integrated circuits, specifically the hardmask selection.

SUMMARY OF THE INVENTION

The present invention describes a damascene process for forming integrated circuit interconnects. In particular a $Ti_{(1-x)}Al_xN$ capping layer is formed over a low dielectric constant dielectric layer. A trench is formed in the dielectric layer using the capping layer as a hardmask. Copper is then used to fill the trench thereby forming the integrated circuit interconnect.

In another embodiment of the invention, first and second trenches are formed in the dielectric layer. The second trench is positioned above the first trench. The capping layer is used as a hardmask for the formation of both the first and second trench. Copper is then used to form a contiguous layer in both the first and second trench.

DETAILED DESCRIPTION OF THE INVENTION

The invention will now be described with reference to FIGS. 1–5. It will be apparent to those of ordinary skill in the art that the benefits of the invention can be applied to other structures where a damascene process is utilized.

The requirement of higher clock speed has lead to the use of copper to form the metal interconnect lines in integrated circuits. In addition to the use of copper, dielectric layers such as organosilicate glass (OSG) (dielectric constant ~2.7–3.0) are currently being used to take advantage of the lower dielectric constant of such materials compared to silicon dioxide.

Figure 1:
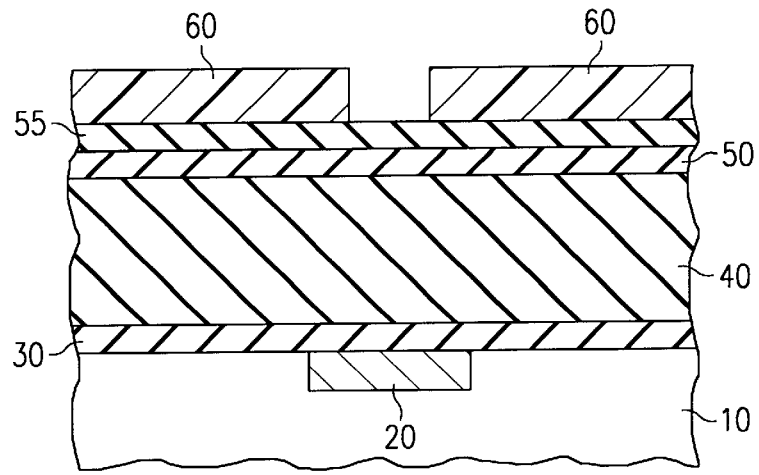
FIGS. 1–5 are cross-sectional diagrams illustrating an embodiment of the instant invention.

In an embodiment of the instant invention, an etch stop layer 30 is formed over a copper layer 20 and a dielectric layer 10. The dielectric layer 10 is formed over a silicon substrate which contains one or more electronic devices such as transistors, diodes, etc. These electronic devices will typically be part of an integrated circuit. The dielectric layer 10 may be formed over various portions of an integrated circuit. The copper layer 20 represents a portion of the copper interconnect of the integrated circuit. The etch stop layer may comprise silicon nitride (SiN), silicon carbide (SiC), or any suitable material with good etch selectivity and preferably low dielectric constant. Following the formation of the etch stop layer 30, a dielectric film 40 with a low dielectric constant (i.e. less that 3.0) is formed over the etch stop layer 30. In an embodiment of the instant invention this low k dielectric film 40 comprises organosilicate glass (OSG) which has a dielectric constant of about 2.8. In addition to OSG films, any suitable low k dielectric film may be used to form the dielectric layer 40. Following the formation of the low k dielectric layer 40, a capping layer 50 is formed. This capping layer 50 comprises a material selected from the group consisting of titanium aluminide (TiAl), titanium aluminum nitride (TiAlN), titanium nitride (TiN), aluminum nitride (AlN), tantalum aluminide (TaAl), tantalum aluminum nitride, or any combination of layers of these various alloys. In an embodiment of the instant invention $Ti_{(1-x)}Al_xN$ is used with x varying from 0 to 100% and more preferably from 25% to 40%. For a $Ti_{(1-x)}Al_xN$ film where x varies from 25% to 40% the etch rate selectivity of OSG to $Ti_{(1-x)}Al_xN$ is approximately 15:1 indicating that the OSG layer will etch fifteen times faster that the $Ti_{(1-x)}Al_xN$ layer. Following the formation of the capping layer 50, a layer of antireflective coating (BARC) 55 is formed followed by a photoresist layer 60 which is patterned as shown in FIG. 1. The antireflective coating 55 is an optional layer.

Figure 2:
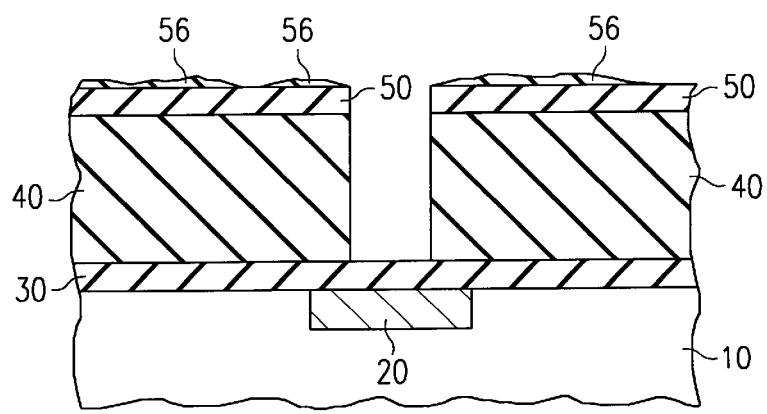
Figure 2A:
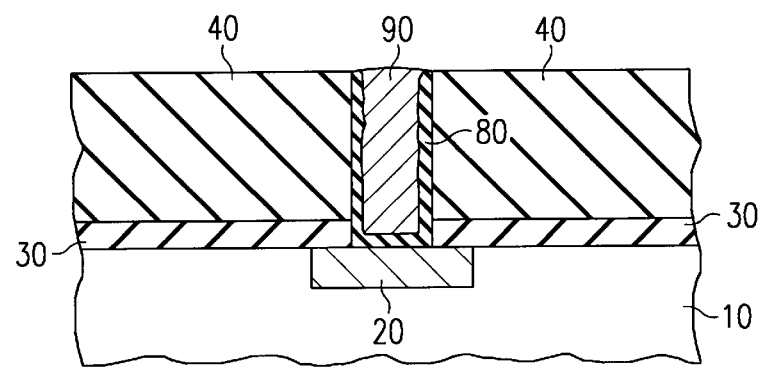

Shown in FIG. 2 is the structure of FIG. 1 following the etching of the low k dielectric layer 40 to form a first trench. In an embodiment of the instant invention, the BARC layer is etched first, then the $Ti_{(1-x)}Al_xN$ capping layer is etched with a dry plasma etch process comprising $BCl_3, Cl_2$ and other additives such as $N_2$ and Ar, and a plasma source power of approximately 800 Watts to 1500 Watts, and a bias power of approximately 50–250 Watts. The flow rates of $BCl_3$ and $Cl_2$ are 0–150 sccm and 50–200 sccm respectively and the chamber pressure is approximately 5 mTorr to 20 mTorr. Following the capping layer etch, the low k dielectric layer 40 is etched. In the case of an OSG layer a $C_4F_8/N_2/CO$ plasma based process can be used with flow rates of 5–10 sccm ($C_4F_8$), 50–300 sccm ($N_2$), and 50–200 sccm (CO) with a plasma power source of approximately 900 Watts to 2000 Watts. The photoresist layer 60 will be attacked during the etching processes and will be partially or wholly removed. Shown in FIG. 2 is the residual layer 56 remaining following the etching processes. This residual layer 56 can comprise photoresist and/or BARC as shown in FIG. 2. For a single damascene process, the residual layer 56 is removed using ash and/or wet clean processes. The capping layer 50 can be optionally removed using a cl-based plasma etch. The portion of the exposed etch stop layer 30 covering the copper layer 20 is removed using a standard etch-stop etch process. A liner layer 80 and copper layer 90 will be formed to provide electrical contact to the underlying copper layer 20 as illustrated in FIG. 2 (a). As shown in FIG. 2 (a), the copper filled trench extends through the dielectric layer 40. In other embodiments of the instant invention the depth of the trench can be less that the thickness of the dielectric layer. In addition to copper any suitable electrically conducting material can be used to fill the via. Standard semiconductor process techniques can be used to form the liner layer 80 and copper layer 90 such as film deposition and chemical mechanical polishing (CMP). In a further embodiment of the single damascene process, the capping layer can be removed using CMP. Typically the copper layer 90 is formed by first forming a thick layer of copper followed by CMP processes to remove the excess copper. The removal of the capping layer 50 using CMP can be incorporated into this copper CMP removal process by changing the polishing conditions. The single damascene copper trench formation in the IMD can be accomplished in a similar way.

Figure 3:
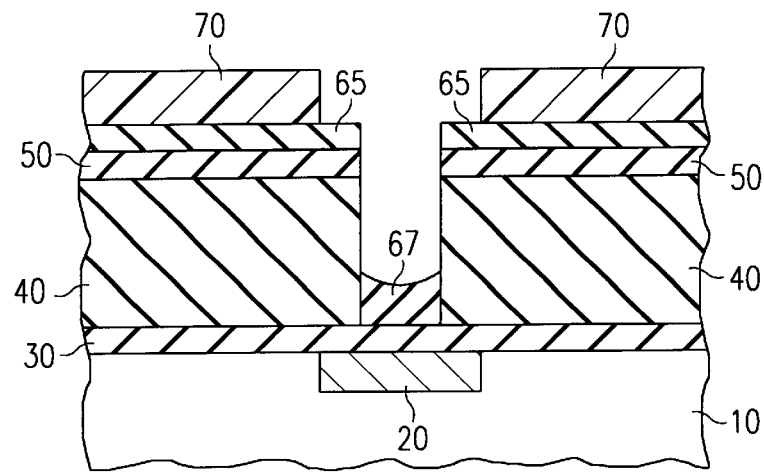

For a dual damascene process, a second BARC layer 65 and patterned photoresist film 70 are formed on the structure of FIG. 2 as shown in FIG. 3. Prior to the formation of the BARC layer 65 the residual layer 56 from the previous processing steps is removed. The capping layer used for first trench etch hardmask is not removed, and will be served as the second trench etch hardmask as well. During formation of the BARC layer 65, an addition BARC region 67 is formed over the exposed portion of the etch stop layer 30. This additional BARC region 67 will protect the etch stop region during the subsequent etch processes.

Figure 4:
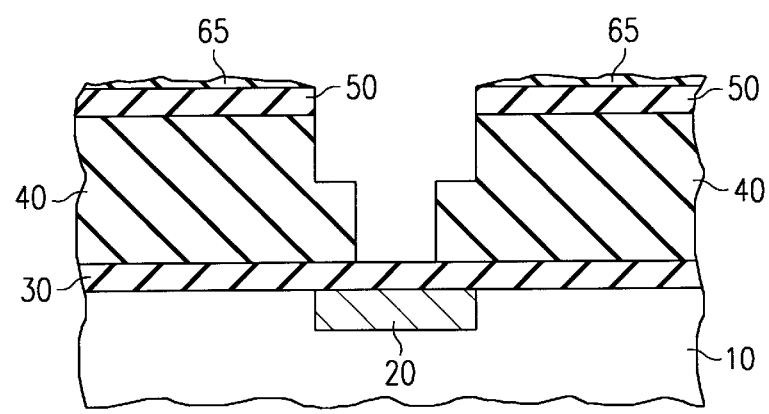

As shown in FIG. 4 the exposed portion of the BARC layer 65 on the top surface and the capping layer 50 are etched using the above described plasma etch process. This is followed by a timed etch process to etch the low k dielectric layer 40 to form a second trench. During the etching, the BARC region 67, the photoresist layer 70, and the BARC layer 65 will be partially or wholly removed.

Figure 5:
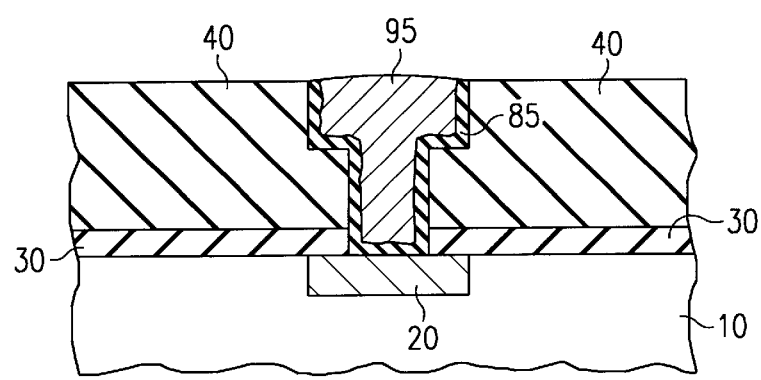

Following a clean up process to remove any remaining BARC and/or photoresist, the exposed portion of the etch stop layer 30 is etched. A liner layer 85 and a copper layer 95 are formed as shown in FIG. 5. In addition to copper any suitable electrically conducting material can be used to fill the dual damascene first and second trenches. In a further embodiment of the dual damascene process, the capping layer can be removed using CMP. Typically the copper region 95 is formed by first forming a thick layer of copper followed by CMP processes to remove the excess copper. The removal of the capping layer 50 using CMP can be incorporated into this copper CMP removal process by changing the polishing conditions.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming interconnects, comprising:

providing a silicon substrate containing one or more electronic devices;

forming a first dielectric layer over said silicon substrate;

forming a second dielectric layer over said first dielectric layer wherein the dielectric constant of the second dielectric layer is less than 3.0;

forming a capping layer on said second dielectric layer wherein said capping layer consists of a material selected form the group consisting of titanium aluminide (TiAl), titanium aluminum nitride (TiAlN), titanium nitride (TiN), aluminum nitride (AlN), tantalum aluminide (TaAl), and tantalum aluminum nitride (TaAlN);

forming a trench in said second dielectric; and filling said trench with a conducting material.

2. The method of claim 1 wherein said second dielectric layer is OSG.

3. The method of claim 1 wherein said conducting material is copper.

4. A method for forming integrated circuit interconnects, comprising:

providing a silicon substrate containing one or more electronic devices;

forming a first dielectric layer over said silicon substrate;

forming a second dielectric layer over said etch stop layer wherein the dielectric constant of the second dielectric layer is less than 3.0;

forming a capping layer on said second dielectric layer wherein said capping layer consists of a material selected form the group consisting of titanium aluminide (TiAl), titanium aluminum nitride (TiAlN), titanium nitride (TiN), aluminum nitride (AlN), tantalum aluminide (TaAl), and tantalum aluminum nitride (TaAlN);

forming a first trench in said second dielectric wherein said first trench has a first width; forming a second trench in said second dielectric wherein said second trench has a second width different from said first width and said second trench is positioned over said first trench; and filling said first and second trench with a conducting material.

5. The method of claim 4 wherein said second dielectric layer is OSG.

6. The method of claim 4 wherein said conducting material is copper.

\* \* \* \* \*